United States Patent
Lin

(10) Patent No.: US 7,443,171 B2
(45) Date of Patent: Oct. 28, 2008

(54) DEVICES AND METHODS FOR DETECTING CURRENT LEAKAGE BETWEEN DEEP TRENCH CAPACITORS IN DRAM DEVICES

(75) Inventor: Yu-Chang Lin, Yunlin (TW)

(73) Assignee: Nanya Technology Corporation, Taoyuan (TW)

( * ) Notice: Subject to any disclaimer, the term of this patent is extended or adjusted under 35 U.S.C. 154(b) by 121 days.

(21) Appl. No.: 11/619,313

(22) Filed: Jan. 3, 2007

(65) Prior Publication Data

US 2007/0111341 A1    May 17, 2007

Related U.S. Application Data

(62) Division of application No. 10/979,609, filed on Nov. 2, 2004, now Pat. No. 7,348,596.

(30) Foreign Application Priority Data

Mar. 9, 2004    (TW) ............................... 93106133 A

(51) Int. Cl.
*G01R 31/08*    (2006.01)
(52) U.S. Cl. ...................... 324/523; 324/713; 365/149
(58) Field of Classification Search ................ 324/523, 324/713; 365/149
See application file for complete search history.

(56) References Cited

U.S. PATENT DOCUMENTS

| 6,339,228 | B1 | 1/2002 | Iyer et al. |
| 6,617,180 | B1 | 9/2003 | Wang |
| 2002/0118035 | A1* | 8/2002 | Yang et al. ................... 324/769 |
| 2004/0017710 | A1 | 1/2004 | Chang et al. |
| 2004/0061110 | A1 | 4/2004 | Felber et al. |
| 2004/0061112 | A1 | 4/2004 | Felber et al. |

* cited by examiner

*Primary Examiner*—Vincent Q Nguyen
(74) *Attorney, Agent, or Firm*—Quintero Law Office

(57) ABSTRACT

A test device for detecting current leakage between deep trench capacitors in DRAM devices. The test device is disposed in a scribe line region of a wafer. In the test device, a first trench capacitor pair has a first deep trench capacitor and a second deep trench capacitor connected in parallel. A first transistor has a first terminal electrically coupled to the first deep trench capacitor and a control terminal electrically coupled to a first word line. A second transistor has a first terminal electrically coupled to the second deep trench capacitor and a control terminal electrically coupled to a second word line. First and second bit lines are electrically coupled to the first and second transistors respectively. The first and second bit lines are separated and the first and second word lines are perpendicular to the bit line regions.

4 Claims, 5 Drawing Sheets

DEVICES AND METHODS FOR DETECTING CURRENT LEAKAGE BETWEEN DEEP TRENCH CAPACITORS IN DRAM DEVICES

This application is a divisional of U.S. application Ser. No. 10/979,609, filed Nov. 2, 2004, the entire disclosure of which is hereby incorporated by reference.

BACKGROUND

The invention relates to test devices, and more particularly, to test devices for detecting current leakage between deep trench capacitors in DRAM devices, as well as test methods thereof.

DRAM is an important semiconductor device in the information and electronics industry. Most DRAM carries one transistor and one capacitor in a single DRAM cell. The memory capacity of the DRAM can reach 256 megabytes. Increased integration makes memory cell and transistor size reduction of necessary to accommodate DRAM with higher memory capacity and processing speed. A 3-D capacitor structure, such as a deep trench capacitor, can reduce occupied area on the semiconductor substrate, and is typically applied to the fabrication of DRAM with capacity of 64 megabytes and above.

Conversely, a conversional plane transistor structure covers a plurality of areas of the semiconductor substrate and cannot satisfy the demands for high integration.

FIG. 1 is a layout of conventional deep trench capacitors in a memory device. Deep trench capacitors 10 are disposed under passing word lines. Transistors 14 are electrically coupled to the storage nodes 16 of the capacitors 10 through the diffusion regions 18. The diffusion regions 20 are connected to plugs 22 coupled to bit lines (not shown). The transistors 14 are driven by word lines 12, and the channels thereunder are conductive when appropriate voltages are applied thereto. Consequently, the current produced between the diffusion regions 18 and 20 may flow into or out of the capacitors (storage nodes) 10.

FIG. 2 is a layout of a conventional memory device. As shown, bit line contacts 22 are connected in series by bit lines BL1, BL2 or BL3, and the adjacent deep trench capacitors 10A and 10B, disposed in parallel, can be regarded as a trench capacitor pair 11. Current technology can only detect leakage current between different trench capacitor pairs. For example, current leakage between the capacitor 10B of the trench capacitor pair 11-1 and the capacitor 10A of the trench capacitor pair 11-5, between the capacitor 11A of the trench capacitor pair 11-1 and the capacitor 10B of the trench capacitor pair 11-3, or between the capacitor 10B of the trench capacitor pair 11-1 and the capacitor 10A of the trench capacitor pair 11-4, can be detected by an APDM structure.

Current technology, however, cannot detect current leakage between the capacitors 10B and 10B in each trench capacitor pair 11.

SUMMARY

Some embodiments of the invention provide a test device capable of detecting current leakage between adjacent deep trench capacitors in DRAM devices. The test device is disposed in a scribe line region of a wafer and includes a plurality of bit line regions arranged in parallel. In each bit line region, a first trench capacitor pair has a first deep trench capacitor and a second deep trench capacitor, a first transistor has a first terminal electrically coupled to the first deep trench capacitor and a control terminal electrically coupled to a first word line. A second transistor has a first terminal electrically coupled to the second deep trench capacitor and a control terminal electrically coupled to a second word line. The first and second bit lines are electrically coupled to the first and second transistors respectively. The first bit lines in the bit line regions are connected, the second bit lines in the bit line regions are connected, the first and second bit lines are separated and the first and second word lines are perpendicular to the bit line regions. A current leakage between the first and second deep trench capacitors is determined according to whether the first and second bit lines are electrically coupled when the first and second transistors are turned on.

Embodiments of the invention also provide a test method capable of detecting current leakage between adjacent deep trench capacitors in DRAM devices. In the test method, a wafer with at least one scribe line and at least one memory region is provided. A plurality of memory cells are formed in the memory region and at least one test device is formed in the scribe line region simultaneously, wherein each memory cell has a deep trench capacitor and a corresponding transistor. The first and second transistors are turned on. Current leakage between the first and second deep trench capacitors of the test device can be detected when the first and second bit lines are electrically coupled. Current leakage between first and second bit lines of the test device indicates that current leakage exists between the deep trench capacitors in the memory region.

BRIEF DESCRIPTION OF THE DRAWINGS

The invention can be more fully understood by the subsequent detailed description and examples with reference made to the accompanying drawings, wherein.

DETAILED DESCRIPTION

Figure 2:
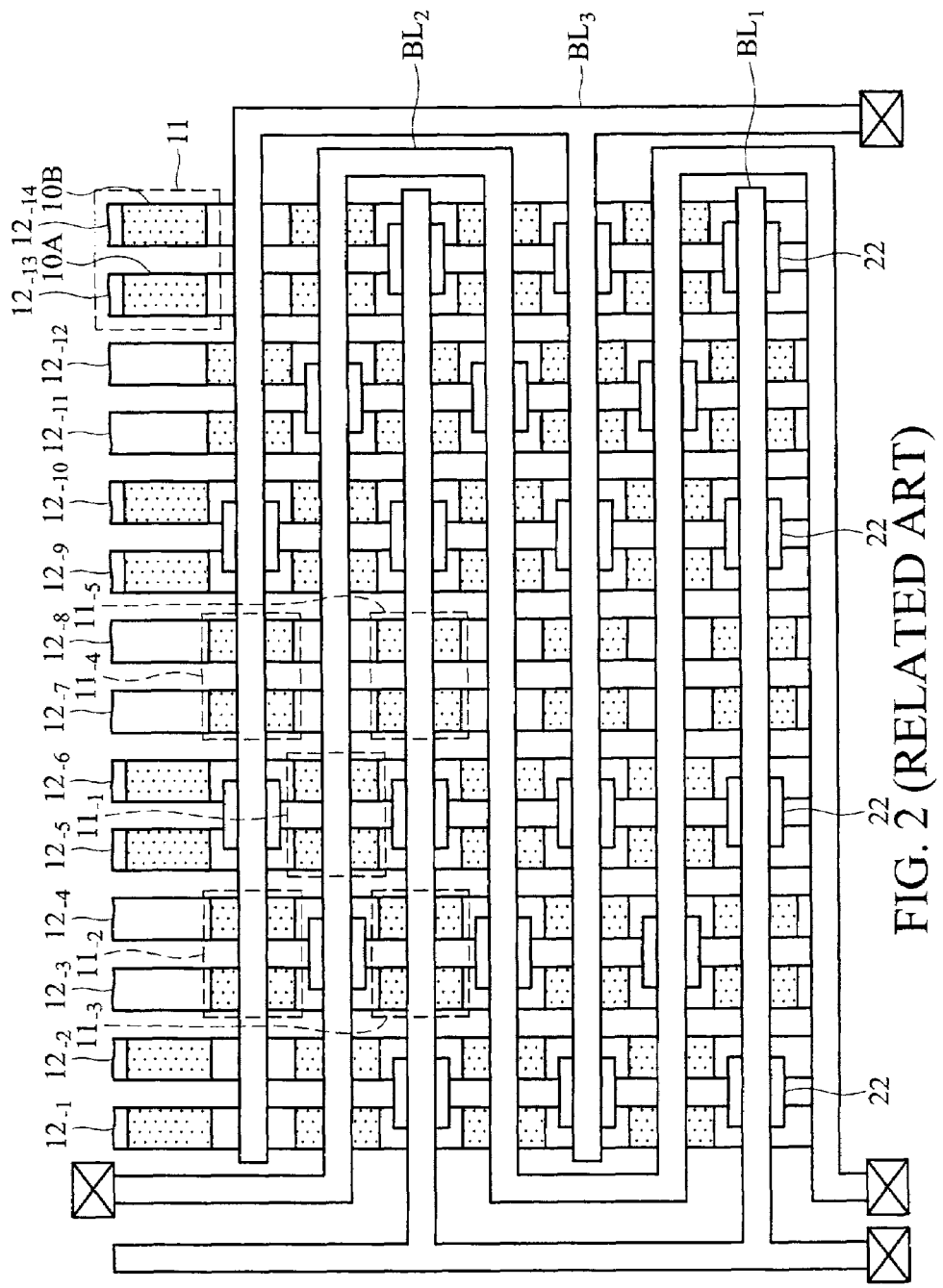
FIG. 2 is a layout of a conventional memory device.
Figure 3:
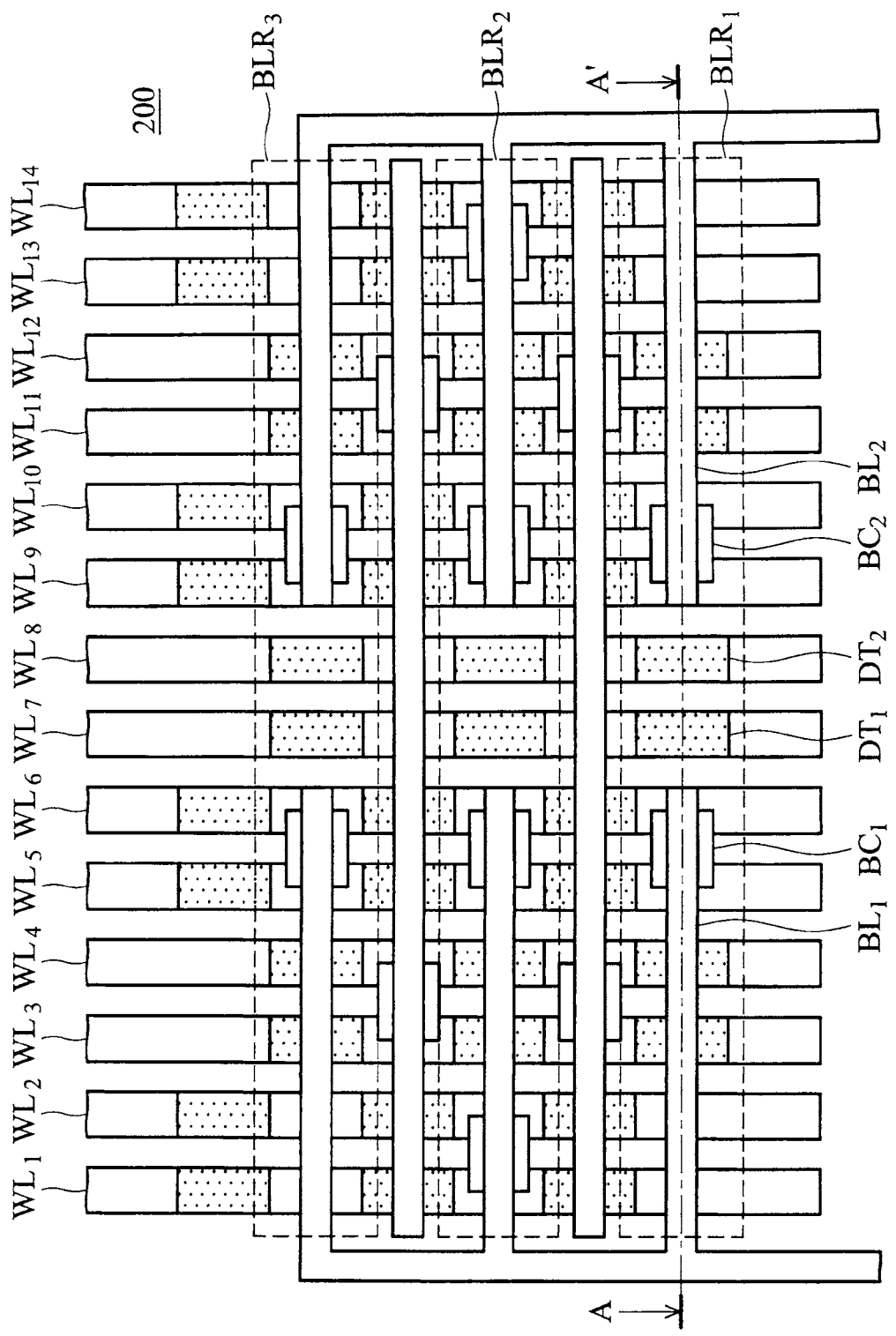
FIG. 3 is a diagram of a test device of an embodiment of the invention.

FIG. 3 shows an embodiment of a test device capable of detecting current leakage between adjacent deep trench capacitors in DRAM devices. The test device 200 is formed in the scribe line region of a wafer (not shown) and a plurality of memory cells are formed in the memory region simultaneously, wherein the test device has a structure as shown in FIG. 3 and the memory region with memory cells is similar to that as shown in FIG. 1 and FIG. 2.

Figure 1:
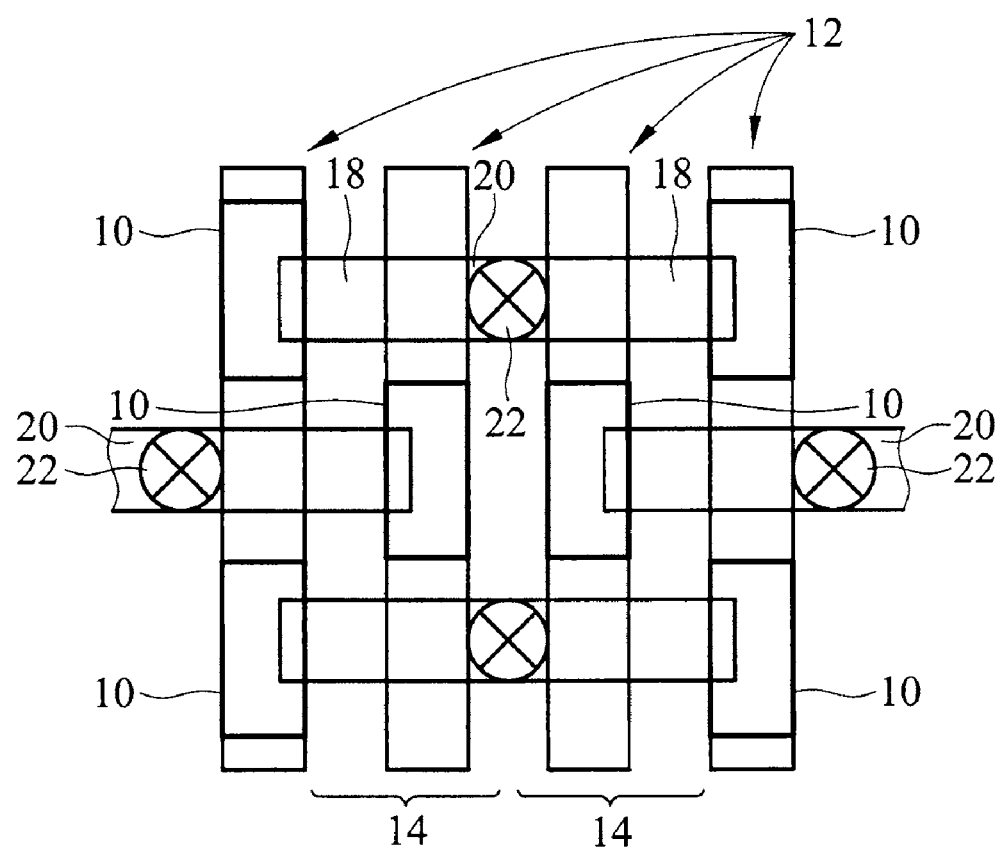
FIG. 1 is a layout of conventional deep trench capacitors in a memory device.

As shown in FIG. 1, transistors 14 are electrically coupled to the storage nodes 16 of the capacitors 10 through the diffusion regions 18. The diffusion regions 20 are connected to plugs 22 coupled to bit lines (not shown). The transistors 14 are driven by word lines 12, and the channels thereunder are conductive when appropriate voltages are applied thereto. Consequently, the current produced between the diffusion regions 18 and 20 may flow into or out of the capacitors (storage nodes) 10. All bit line contacts are electrically connected in series by bit lines $BL_1$, $BL_2$ and $BL_3$ as shown in FIG. 2.

Figure 4:
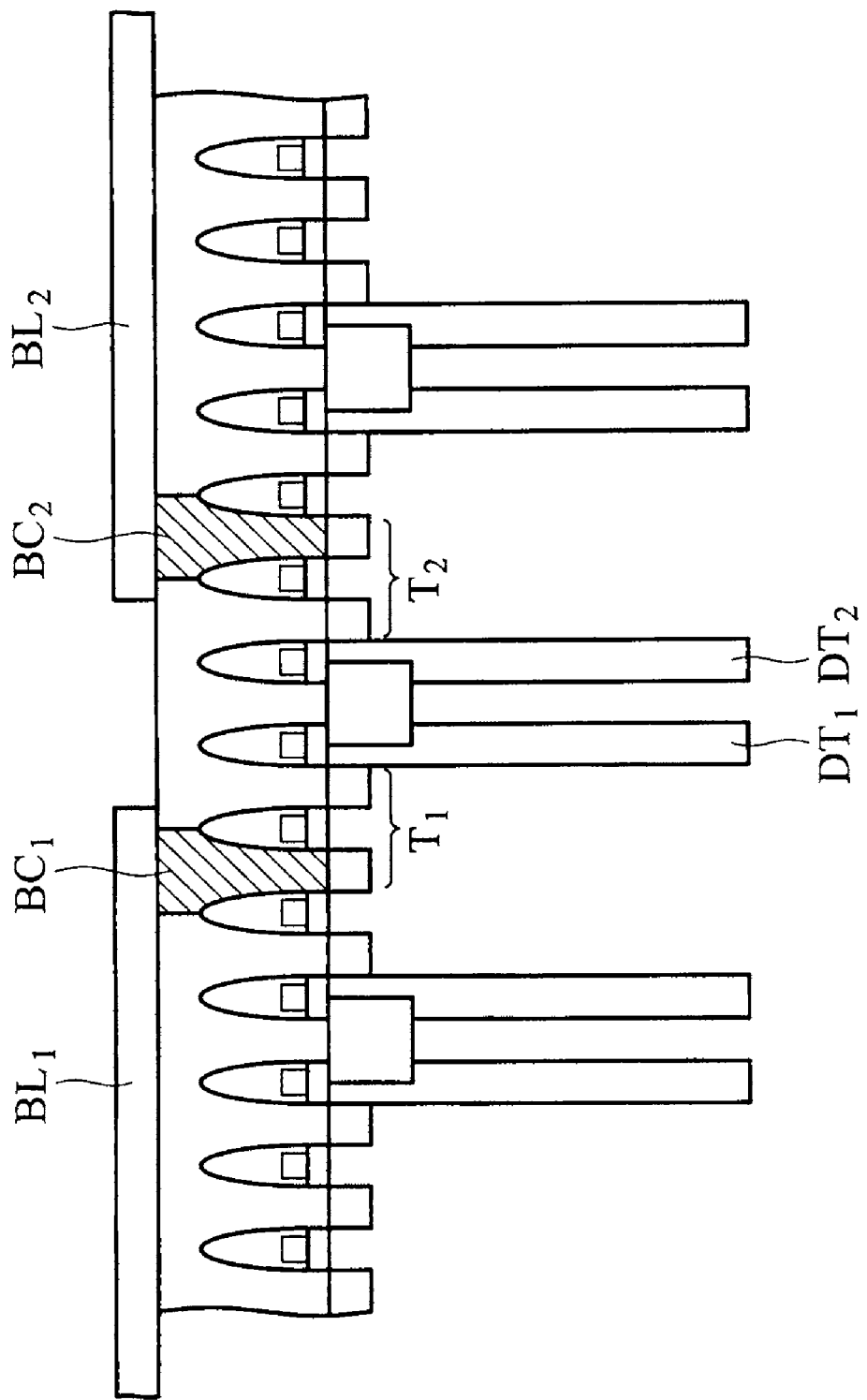
FIG. 4 is a section view of the test device 200 of an embodiment of the invention taken along a line AA' in FIG. 3.

FIG. 3 shows an embodiment of the test device of the invention. The test device 200 includes a plurality of bit line regions $BLR_1$~$BLR_3$ each having a first deep capacitor pair ($DT_1$ and $DT_2$), first and second transistors (not shown in FIG. 3), and first and second bit lines $BL_1$ and $BL_2$. FIG. 4 is a section view of the test device 200 taken along a line AA' in FIG. 3.

In some embodiments of the invention, the adjacent deep trench capacitors $DT_1$ and $DT_2$ are defined as a first deep trench capacitor pair, and the deep trench capacitors $DT_1$ and $DT_2$ are disposed in parallel in the scribe line region (not shown). Further, the two capacitors in each deep trench capacitor pair are not disposed under the same word line.

The first transistor $T_1$ includes a first terminal electrically coupled to the first deep trench capacitor $DT_1$, and a gate terminal electrically coupled to a word line $WL_6$. The second transistor $T_2$ includes a first terminal electrically coupled to the deep trench capacitor $DT_2$, and a gate terminal electrically coupled to a word line $WL_9$. In some embodiments of the invention, all the word lines $WL_1$~$WL_{14}$ are perpendicular to the bit line regions $BLR_1$~$BLR_3$.

The bit line $BL_1$ is electrically coupled to a second terminal of the first transistor $T_1$ through a bit line contact $BC_1$, and the bit line $BL_2$ is electrically coupled to a second terminal of the second transistor $T_2$ through a bit line contact $BC_2$. In some embodiments, the all first bit lines $BL_1$ in the bit line regions $BLR_1$~$BLR_3$ are electrically connected to together, the all second bit lines BL2 in the bit line regions $BLR_1$~$BLR_3$ are electrically connected to together, but the bit lines $BL_1$ and $BL_2$ in the each bit line regions $BLR_1$~$BLR_3$ are separated from each other, as shown in FIG. 3.

Figure 5:
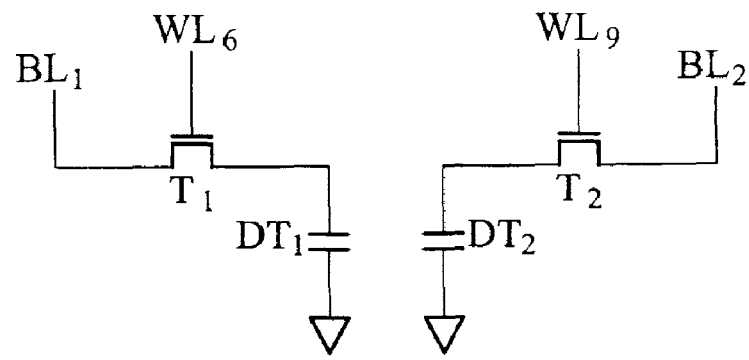
FIG. 5 is a diagram of the test device 200 as shown in FIG. 4.

FIG. 5 is a diagram of the test device 200 as shown in FIG. 4. In some embodiments, when attempting to determine whether there is a current leakage between the first and second deep trench capacitors $DT_1$ and $DT_2$, an appropriate voltage is applied to the word lines $WL_6$ and $WL_9$ to turn on the transistors $T_1$ and $T_2$. Another appropriate voltage, such as 3V, is applied to the first bit line $BL_1$, and the second bit line $BL_2$ is grounded. Current leakage between the first and second deep trench capacitors $DT_1$ and $DT_2$ can then be detected according to whether the first and second bit lines are electrically coupled.

Any current between the bit lines $BL_1$ and $BL_2$ is detected as there is no conductive path between the bit lines $BL_1$ and $BL_2$ for flowing current, indicating that current leakage is present between the deep trench capacitors $DT_1$ and $DT_2$. Thus, it can be ascertained whether there is a current leakage between the first and second deep trench capacitors $DT_1$, and $DT_2$ by determining whether the bit lines $BL_1$ and $BL_2$ are electrically connected when the first and second transistors are turned on.

Figure 6:
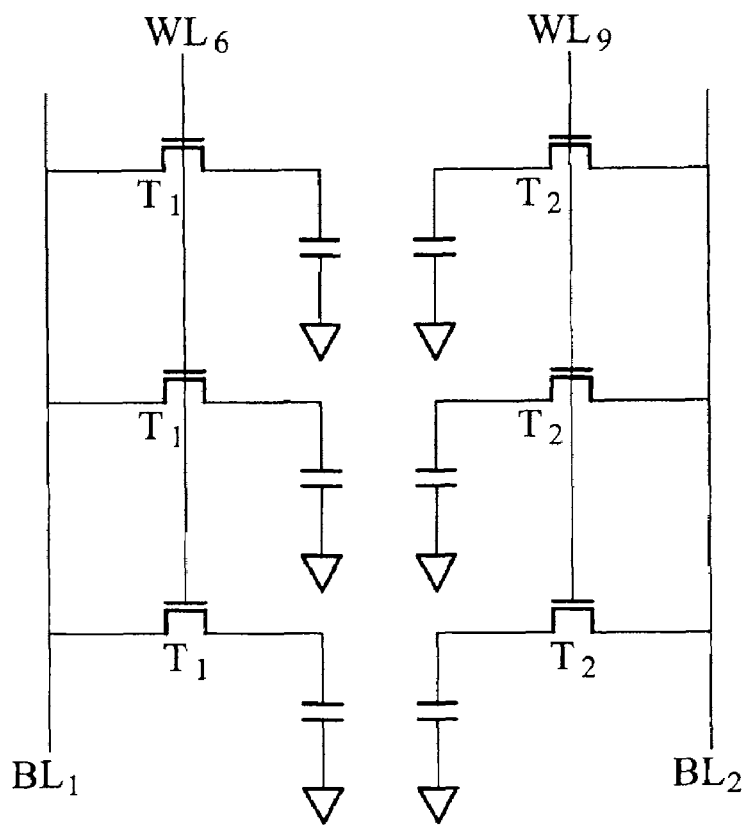
FIG. 6 is diagram of the test device 200 shown in FIG. 3.

FIG. 6 is diagram of the test device 200 shown in FIG. 3. As shown, the test device 200 includes three bit line regions $BLR_1$~$BLR_3$, wherein all bit lines $BL_1$ are connected to together, and all bit lines $BL_2$ are connected. Therefore, current can be determined when current leakage between the first and second capacitors $DT_1$ and $DT_2$ in the test device can be detected.

The test device 200 disposed in the scribe line region and a plurality of memory cells in the memory region are formed simultaneously. For example, the deep trench capacitors 10, 10A and 10B of the memory cells in the memory region and the first and second deep trench capacitors $DT_1$, and $DT_2$ in the test device 200 are formed simultaneously using the same masks, process and conditions. The word lines 12 and $12_{-1}$~$12_{-14}$ of the memory cells in the memory region and the word lines $WL_1$ ~$WL_{14}$ are formed simultaneously using the same masks, process and conditions. The bit lines $BL_1$~$BL_3$ and bit line contacts 22 of the memory cells in the memory region and the bit lines $BL_1$ and $BL_2$ and bit line contacts $BC_1$ and $BC_2$ of the test device are formed simultaneously using the same masks, process and conditions. Thus, the memory region and the test device may have the same current leakage between deep trench capacitors.

Some embodiments of the invention also provide a test method capable of detecting current leakage between adjacent deep trench capacitors in DRAM devices including as following. A wafer with at least one scribe line and at least one memory region is provided.

A plurality of memory cells are formed in the memory region and at least one test device 200 is formed in the scribe line region simultaneously, wherein each memory cell has a deep trench capacitor and a corresponding transistor as shown in FIG. 1 and FIG. 2, and the test device 200 has the structure as shown in FIG. 3.

An appropriate voltage is applied to the word lines $WL_6$ and $WL_9$ to turn on the transistors $T_1$ and $T_2$, another appropriate voltage, such as 3V, is applied to the first bit line $BL_1$ and the second bit line $BL_2$ is grounded.

Current leakage between the first and second deep trench capacitors $DT_1$, and $DT_2$ of the test device 200 is detected according to whether the first and second bit lines $BL_1$, and $BL_2$ are electrically coupled to each other. Any current between the bit lines $BL_1$ and $BL_2$ is detected as there is no conductive path between the bit lines $BL_1$ and $BL_2$ for flowing current, indicating that current leakage is present between the deep trench capacitors $DT_1$, and $DT_2$ In some embodiments of the invention, the test device 200 disposed in the scribe line region and a plurality of memory cells in the memory region are formed simultaneously. For example, the deep trench capacitors 10, 10A and 10B of the memory cells in the memory region and the first and second deep trench capacitors $DT_1$, and $DT_2$ in the test device 200 are formed simultaneously using the same masks, process and conditions. The word lines 12 and $12_{-1}$~$12_{-14}$ of the memory cells in the memory region and the word lines $WL_1$~$WL_{14}$ are formed simultaneously using the same masks, process and conditions. The bit lines $BL_1$~$BL_3$ and bit line contacts 22 of the memory cells in the memory region and the bit lines $BL_1$ and $BL_2$ and bit line contacts $BC_1$ and $BC_2$ of the test device are formed simultaneously with the same masks, process and conditions. Therefore, the memory region and the test device may have the same current leakage between deep trench capacitors.

Thus, current leakage between capacitors in the memory region can be detected according to whether there is current leakage between the first and second deep trench capacitors $DT_1$, and $DT_2$ of the test device 200. Wherein the current leakage between the adjacent deep trench capacitors $DT_1$ and $DT_2$ of the test device 200 indicates current leakage between the adjacent deep trench capacitors in the memory region.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for detecting current leakage between deep trench capacitors in DRAM devices, comprising:
   providing a wafer with at least one scribe line and at least one memory region;
   forming a plurality of memory cells in the memory region and at least one test device in the scribe line region simultaneously, wherein each memory cell has a deep trench capacitor and a corresponding transistor, the test device comprises a plurality of bit line regions each including:

a first trench capacitor pair having a first deep trench capacitor and a second deep trench capacitor;

a first transistor having a first terminal electrically coupled to the first deep trench capacitor and a control terminal electrically coupled to a first word line;

a second transistor having a first terminal electrically coupled to the second deep trench capacitor and a control terminal electrically coupled to a second word line;

a first bit line electrically coupled to the first transistor; and a second bit line electrically coupled to the second transistor, wherein the first bit lines in the bit line regions are connected, the second bit lines in the bit line regions are connected, the first and second bit lines are separated and the first and second word lines are perpendicular to the bit line regions;

turning the first and second transistors on; and determining whether there is current leakage between the first and second deep trench capacitors of the test device according to whether the first and second bit lines are electrically coupled to each other, wherein the current leakage between first and second bit lines of the test device indicates that current leakage is present between the deep trench capacitors in the memory region.

2. The method as claimed in claim 1, wherein the first bit line is electrically connected to the first transistor through a first bit line contact.

3. The method as claimed in claim 2, wherein the second bit line is electrically connected to the second transistor through a second bit line contact.

4. The method as claimed in claim 1, further comprising a step of applying a voltage to the first bit lines of the test device and grounding the second bit lines of the test device.

* * * * *